(12) United States Patent
Bedell et al.

(10) Patent No.: US 9,064,743 B2
(45) Date of Patent: Jun. 23, 2015

(54) FLEXIBLE, STRETCHABLE ELECTRONIC DEVICES

(71) Applicant: International Business Machines Corporation, Armonk, NY (US)

(72) Inventors: Stephen W. Bedell, Wappingers Falls, NY (US); Wilfried E. Haensch, Somers, NY (US); Bahman Hekmatshoartabari, White Plains, NY (US); Ghavam G. Shahidi, Pound Ridge, NY (US); Davood Shahrjerdi, White Plains, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/556,200

(22) Filed: Nov. 30, 2014

(65) Prior Publication Data

US 2015/0123204 A1    May 7, 2015

Related U.S. Application Data

(62) Division of application No. 13/917,302, filed on Jun. 13, 2013, now Pat. No. 8,927,338.

(51) Int. Cl.
*H01L 27/01* (2006.01)
*H01L 27/12* (2006.01)
(Continued)

(52) U.S. Cl.
CPC ............ *H01L 27/1203* (2013.01); *H01L 23/14* (2013.01); *H01L 27/092* (2013.01)

(58) Field of Classification Search
CPC ............... H01L 23/14; H01L 23/5381; H01L 21/76259; H01L 27/1203; H01L 27/092
USPC .......... 257/350, 351, 368, 369, 374, 773, 776
See application file for complete search history.

(56) References Cited

U.S. PATENT DOCUMENTS

| 6,743,982 B2 | 6/2004 | Biegelsen |
| 7,491,892 B2 | 2/2009 | Wagner et al. |

(Continued)

FOREIGN PATENT DOCUMENTS

| KR | 1020100131593 | 12/2010 |
| WO | 2010086034 | 8/2010 |

OTHER PUBLICATIONS

Stephen W. Bedell et al., unpublished U.S. Appl. No. 13/917,302 "Flexible, Stretchable Electronic Devices" filed Jun. 13, 2013 (parent of this application).

*Primary Examiner* — Kevin M Picardat
(74) *Attorney, Agent, or Firm* — Louis J. Percello; Otterstedt, Ellenbogen & Kammer, LLP

(57) ABSTRACT

Fabrication methods are disclosed that facilitate the production of electronic structures that are both flexible and stretchable to conform to non-planar (e.g. curved) surfaces without suffering functional damage due to excessive strain. Electronic structures including CMOS devices are provided that can be stretched or squeezed within acceptable limits without failing or breaking. The methods disclosed herein further facilitate the production of flexible, stretchable electronic structures having multiple levels of intra-chip connectors. Such connectors are formed through deposition and photolithographic patterning (back end of the line processing) and can be released following transfer of the electronic structures to flexible substrates.

3 Claims, 6 Drawing Sheets

(51) Int. Cl.
*H01L 23/14* (2006.01)
*H01L 27/092* (2006.01)

(56) References Cited

U.S. PATENT DOCUMENTS

| | | |
|---|---|---|
| 8,207,473 B2 | 6/2012 | Axisa et al. |
| 8,258,011 B2 | 9/2012 | Brun |
| 8,349,727 B2 | 1/2013 | Guo |
| 8,484,836 B2 | 7/2013 | Lanzara et al. |
| 8,513,532 B2 | 8/2013 | Chen et al. |
| 2008/0157235 A1 | 7/2008 | Rogers |
| 2009/0283891 A1 | 11/2009 | Dekker |
| 2010/0002402 A1 | 1/2010 | Rogers |
| 2010/0116526 A1 | 5/2010 | Arora |
| 2010/0311250 A1 | 12/2010 | Bedell |
| 2012/0052268 A1 | 3/2012 | Axisa |
| 2012/0106095 A1 | 5/2012 | Daniel |

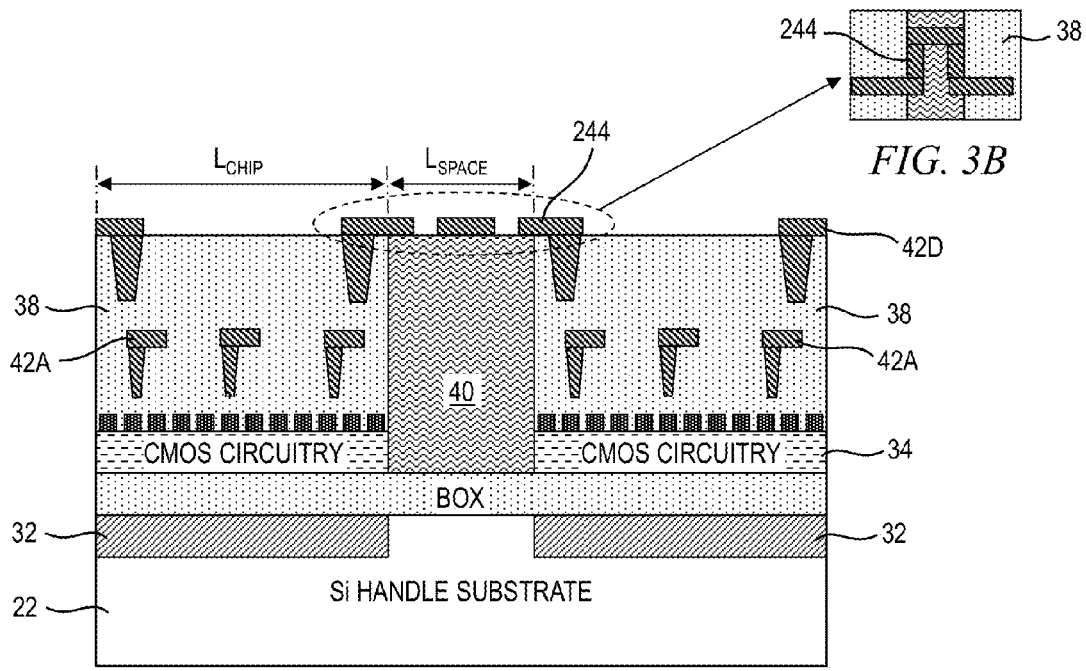
FIG. 3B
FIG. 3A
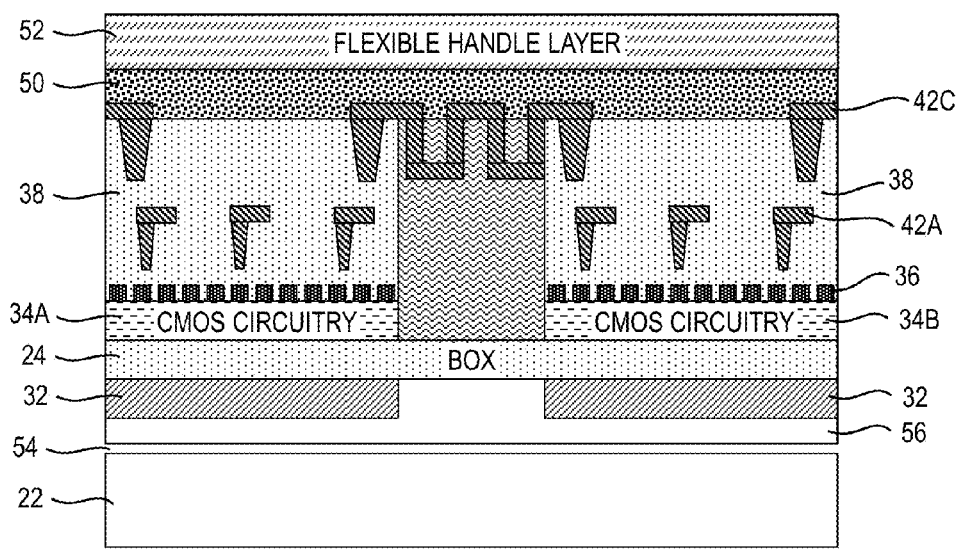
FIG. 4

FLEXIBLE, STRETCHABLE ELECTRONIC DEVICES

CROSS-REFERENCE TO RELATED APPLICATIONS

This patent application is a divisional of U.S. patent application Ser. No. 13/917,302 filed Jun. 13, 2013, entitled "FLEXIBLE, STRETCHABLE ELECTRONIC DEVICES." The complete disclosure of the aforementioned U.S. patent application Ser. No. 13/917,302 is expressly incorporated herein by reference in its entirety for all purposes.

FIELD

The field of the present disclosure relates to the physical and electrical sciences, and more particularly to electronic devices including chip connections that facilitate compliance of the electronic elements thereof to surface morphology and methods of manufacture thereof.

BACKGROUND

Flexible electronic systems including flexible integrated circuit devices are useful for applications wherein such systems must conform to non-planar surfaces. Conventional electronic components such as complementary metal oxide semiconductor (CMOS) circuits are typically fabricated on rigid substrates. Various schemes have been employed for rendering rigid/stiff materials flexible by thinning/removing the substrate, leaving a relatively thin structure. Such schemes employ, for example, chemical and mechanical polishing and etching, layer lift-off, controlled spalling, and other methods. Despite the flexibility of the structures obtained through such schemes, which is due to the relatively small total thicknesses thereof, the structures are not stretchable, having limited mechanical properties, i.e. fracture toughness, of the overall structure in the other two dimensions. A fabrication method for creating stretchable electronic structures has been proposed that includes making small, thin electronic components using lift-off techniques, transferring small electronic chips to a compliant substrate, and subsequently wiring the chips to one another using serpentine metal wires with low Young's modulus. The relatively small chip sizes make the wiring task in sophisticated systems complicated and challenging due to the large number of required electrical connections.

SUMMARY

Aspects of the present disclosure relate to flexible electronic structures and methods for fabricating such structures.

A first exemplary method includes forming an electronic circuitry layer having first and second circuitry regions on a semiconductor substrate and forming a separator layer separating the first and second circuitry regions of the circuitry layer on the substrate. The method further includes forming a layer comprising electrically insulating material on the circuitry layer, forming an electrical connector layer between the first and second circuitry regions and extending across the separator layer, and removing the separator layer to form a space beneath the electrical connector layer, the space further separating the first and second circuitry regions of the circuitry layer.

A second exemplary method includes obtaining a structure including i) a semiconductor substrate, ii) a circuitry layer comprising first and second circuitry regions deposited on the substrate, the circuitry layer comprising CMOS devices, iii) a separator layer on the substrate that separates the first and second circuitry regions of the circuitry layer, iv) a layer comprising electrically insulating material on the circuitry layer, and v) an electrical connector layer between the first and second circuitry regions and extending across the sacrificial separator layer. The exemplary method further includes thinning the substrate, removing the sacrificial separator layer to form a space above the substrate and beneath the electrical connector layer, and affixing the substrate to a flexible layer.

An exemplary structure includes a semiconductor substrate including an electrically insulating layer, a circuitry layer including first and second CMOS circuitry regions formed on the substrate and adjoining the electrically insulating layer, and a first layer comprising electrically insulating material on the circuitry layer. A separator layer is on the substrate and within the first layer. The separator layer electrically isolates the first and second CMOS circuitry regions. An electrical connector layer electrically connects the first and second circuitry regions. The electrical connector layer is formed within the first layer and extends across the separator layer.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Substantial beneficial technical effects are provided by the exemplary structures and methods disclosed herein. For example, one or more embodiments may provide one or more of the following advantages:

- Enables flexible, stretchable electronic structures;
- Electrical connections formed by deposition and patterning as opposed to bonding or soldering;
- Facilitates providing multiple levels of intra-chip electrical connections;
- Monolithic integration of the intrachip connectors facilitates the integration process.

These and other features and advantages of the present disclosure will become apparent from the following detailed description of illustrative embodiments thereof, which is to be read in connection with the accompanying drawings.

BRIEF DESCRIPTION OF THE DRAWINGS

FIG. 3A is schematic illustration of a structure fabricated in accordance with a third illustrative embodiment;

FIG. 3B is a top plan view of a portion of the structure shown in FIG. 3A;

FIG. 4 is a schematic illustration of a fabrication step including separating the structure shown in FIG. 2B from the handle portion of the substrate;

DETAILED DESCRIPTION

Fabrication methods are disclosed that facilitate the production of electronic structures that are both flexible and stretchable. The flexibility of an electronic structure, such as an integrated circuit, allows it to bend to conform to non-planar (e.g. curved) surfaces without suffering functional damage due to excessive strain. An electronic structure that is also stretchable exhibits tensile strength and can be stretched or squeezed within acceptable limits without failing or breaking. The methods disclosed herein further facilitate the production of flexible, stretchable electronic structures having multiple levels of intra-chip connectors. Such connectors are formed through deposition and photolithographic patterning (back end of the line processing) in one or more exemplary embodiments and released following transfer of the electronic structure to a flexible substrate.

Figure 1:
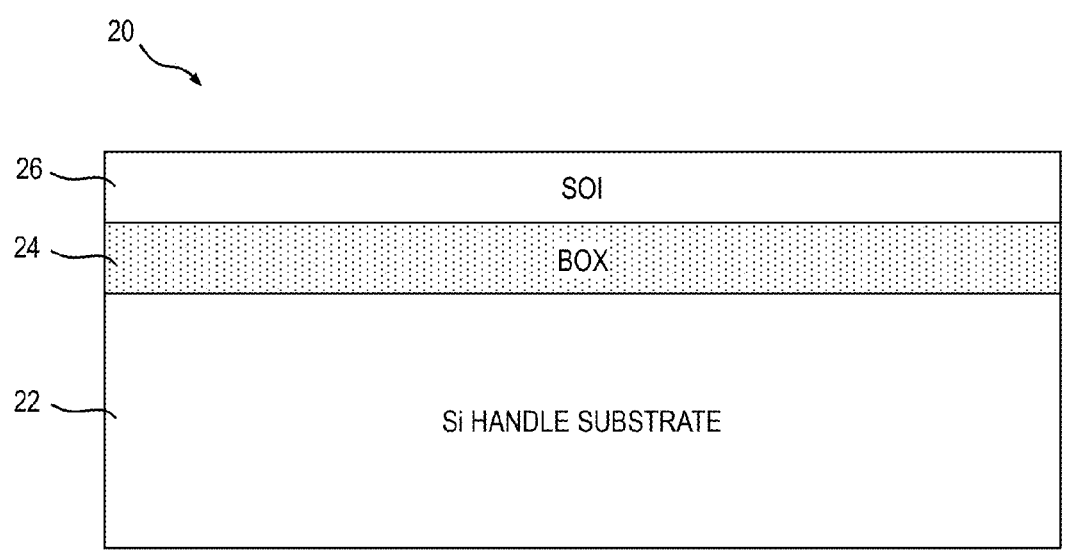
FIG. 1 is a schematic illustration of an exemplary semiconductor on insulator substrate that may be employed during fabrication of the structures disclosed herein.

The fabrication methods and electronic structures disclosed herein are amenable to various CMOS manufacturing techniques familiar to those of skill in the art. It will be appreciated, however, that techniques that vary in some respects from those disclosed herein may be employed for forming other types of electronic devices that benefit from being flexible and stretchable. Referring to FIG. 1, a semiconductor on insulator substrate 20 is obtained. The exemplary substrate includes a silicon handle layer 22, an insulating layer 24 and a semiconductor layer 26 such as crystalline silicon. The insulating layer 24 in one exemplary embodiment is a buried oxide layer such as silicon dioxide. The thickness of the semiconductor layer 26 is between 3 nm-30 μm in exemplary embodiments, but thicker or thinner layers may be usable in some applications. Relatively thin semiconductor layers facilitate the production of mechanically flexible structures as discussed further below. The insulator layer 24 in an exemplary embodiment is between 10-500 nm, but may be thicker or thinner for some applications. Other semiconductor substrates such as bulk silicon substrates (not shown) may alternatively be employed in the fabrication of electronic structures as disclosed herein.

Figure 2A:
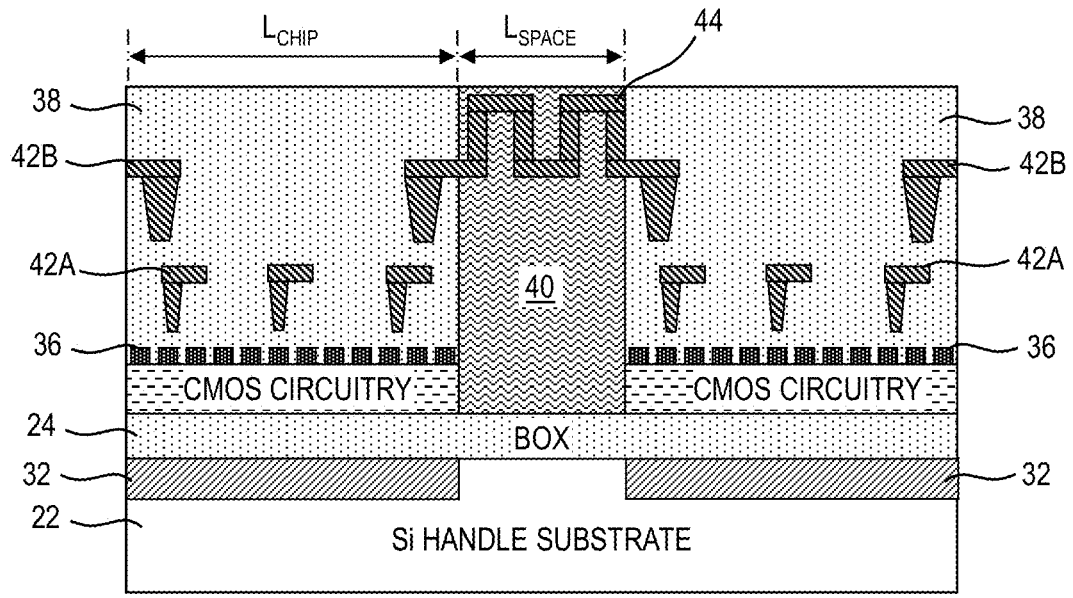
FIG. 2A is a schematic illustration of a structure fabricated in accordance with a first illustrative embodiment.

In one exemplary embodiment, the substrate 20 is employed in the fabrication of an electronic structure as shown in FIG. 2A. An etch stop layer 32 is formed in the handle layer. Ion implantation is employed to form a heavily doped p+ layer in some embodiments, which functions as the etch stop layer 32 and further the etch mask protecting the BOX layer during the removal of the sacrificial separator. The layer is formed as "pockets" in regions beneath the areas that comprise the circuits (chips). In some embodiments, heavily doped n+ pockets are formed in the handle layer 22 rather than p+ pockets using any suitable technique (e.g. ion implantation). Exemplary n-type dopants include arsenic and phosphorus.

An exemplary CMOS process sequence for fabricating a field effect transistor includes: 1) device isolation (silicon removal to form silicon "islands" defining the device active region and filling trenches formed with dielectric material such as silicon dioxide); 2) gate stack and spacer formation; 3) source/drain formation; 4) silicide formation to form contacts to various device electrodes, and 5) middle and back end of the line metallization steps. Referring again to FIG. 2A, a circuitry layer 34 is formed on the crystalline surface layer of the substrate 20. The circuitry layer may include any appropriate number, type and configuration of CMOS devices. Exemplary CMOS devices include field effect transistors, bipolar junction transistors, and non-volatile memory cells, resistors, diodes. Chemical vapor deposition (CVD) is among the known techniques for depositing materials on crystalline silicon during CMOS device fabrication. The circuitry layer 34 shown and described hereafter should be considered exemplary as opposed to limiting. The semiconductor layer 26 between adjoining chips is removed. A contact layer 36 is formed on the circuitry layer 34 for providing electrical connections between the CMOS devices and other elements. Deposition and patterning techniques familiar to those of skill in the art are employed in one or more exemplary embodiments for forming the contact layer. Copper and aluminum are among the electrically conductive materials that can be employed in forming the contact layer 36. Fabrication of the connectors is accordance with one or more embodiments is conducted during the fifth step of the illustrative sequence.

A separator layer 40 is formed directly on the substrate. While shown on the insulating layer 24 of the substrate, the separator layer can extend beyond the insulating layer and inside the silicon handle layer 22. A layer 38 of electrically insulating material is formed on the substrate over the circuitry layer 34 and contact layer 36. The layer 38 may be comprised of silicon dioxide, silicon nitride or other suitable materials. In some embodiments, the insulating (BOX) layer 24 and layer 38 are comprised of materials that can be selectively etched with respect to one another. In other embodiments, they are both comprised of the same material, silicon dioxide being one exemplary material. The spacing between chips, which corresponds to the width ($L_{space}$) of the separator layer 40, may be based at least in part on the extent to which the structure obtained by the fabrication process is intended to stretch or contract. While shown as distinct elements for purpose of explanation, the layer 38 of insulating material and the separator layer 40 may, at least in part, be comprised of the same material(s) and formed simultaneously. They may alternatively be formed from different materials to facilitate selective etching. As discussed below, the separator layer 40 is selectively etched with respect to the layer 38 and is accordingly shown as a separate element. In some embodiments, the separator layer includes layers that are not present within the layer 38 of insulating material. The layer 38 of insulating material and the separator layer 40 are formed such that the separator layer is positioned within the layer 38 of insulating material and between the circuitry regions 34A, 34B.

Metallization is a further step in back end of the line processing, as known to those of skill in the art. The metallization step(s) primarily involve deposition, patterning and etching. In an exemplary embodiment, the layer 38 of insulating material is deposited on the substrate, the layer is patterned using a via mask, and vias are formed in the layer using an appropriate etching process such as plasma etching. A layer of metal such as copper or aluminum is deposited over the entire substrate. Using photolithographic techniques, the metal layer is selectively etched. In some embodiments, the metal layers can be formed using electrochemical processes such as electroplating. A first metal layer 42A is accordingly formed in the chip regions, as shown in the exemplary embodiment of FIG. 2A. Additional metal layers can be formed as required using the same techniques. In the exemplary embodiment of FIG. 2A, a second metal layer 42B is formed with associated vias using appropriate deposition and photolithographic patterning techniques. The second metal layer portions associated with each integrated circuit are electrically connected by an electrical connection layer comprising wires 44 that are also formed during back of the line processing. The wires 44 are also formed in the separator layer using deposition, patterning and etching procedures and are electrically connected with the second metal layer 42B in this exemplary embodiment. It will be appreciated that wires could additionally be formed within the separator layer 40 to connect the first metal layer 42A of each chip region, providing multiple intra-chip connection levels. The electrical connections formed by the wires 44 are solderless.

The separator layer is comprised entirely of sacrificial, selectively etchable material(s) in some embodiments and comprises a multi-layer stack of different materials in other embodiments. For example, one or more layers of the separator layer may comprise a low-k dielectric material having a relatively low modulus of elasticity (Young's modulus). Other layer(s) of the separator layer that are intended to be sacrificial may comprise a material having a relatively high Young's modulus such as silicon dioxide ($SiO_2$). The low-k dielectric material is formed on a sacrificial layer in the region containing the wires 44. In such embodiments, the layer(s) of low-k dielectric material is deposited, patterned and etched to form vias. Prior to filling the vias with an electrically conductive material such as copper, a high-k dielectric material is deposited such that the side walls of the vias are coated with the high-k dielectric material. The high-k dielectric material will accordingly coat the metal wires formed during the subsequent metallization process. Hafnium oxide is an exemplary high-k dielectric material suitable for this process.

Figure 2B:
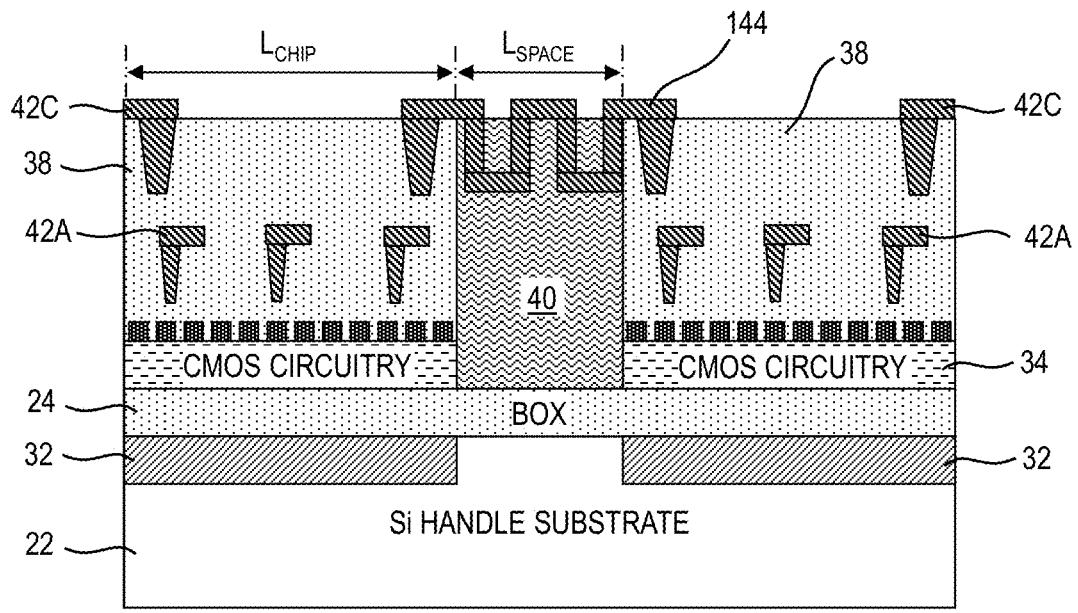
FIG. 2B is a schematic illustration of a structure fabricated in accordance with a second illustrative embodiment.

FIG. 2B shows an alternative embodiment having a first metal layer 42A formed within the layer 38 of electrically insulating material and a second metal layer 42C formed on the structure. The second metal layer 42C and associated vias are formed using deposition and patterning techniques as discussed above on both the layer 38 of insulating material and the separator layer 40. The portions of the second metal layer 42C formed on the separator layer 40 comprise parts of the connecting wires 144 between the chip regions. In this exemplary embodiment, the wires 144 are formed on and within the separator layer 40 to resemble a square wave. The wave-like configuration facilitates stretching and bending of the resulting structure as discussed further below.

A further alternative embodiment of a structure formed in the manner described above is illustrated in FIGS. 3A and 3B. The structure is similar to those shown in FIGS. 2A and 2B and includes the same reference numerals where applicable. In this embodiment, a second metal layer 42D is formed on the structure. The connecting wire 244 between the chip regions is entirely in a plane that is parallel to the circuitry layer. In other words, no part of the connecting wire extends normal to the circuitry layer as in the structures shown in FIGS. 2A and 2B. The top plan view of a portion of this structure shows a possible configuration of the connecting wire formed on the separator layer 40. The connecting wires of the disclosed structures are configured to allow relative movement between circuitry regions without fracturing.

The thickness of the relatively rigid handle layer 22 is reduced once a structure such as shown in FIG. 2A, 2B or 3 is obtained. Various techniques may be employed to perform this step. Referring to FIG. 4, a stressor layer 50 is adhered to the top surface of the structure of FIG. 2B. The stressor layer may be comprised of a metal such as nickel or multiple layers. A flexible handle layer 52 is operatively associated with the stressor layer 50. The flexible handle layer may be comprised of organic polymeric materials such as polyimide and polyethylene terephthalate (PET). The stressor and handle layers are employed for causing a fracture 54 in the rigid handle layer 22 via the controlled spalling. The resulting structure includes a residual silicon layer 56. The handle portion of the initial substrate, once separated from the structure, can be reused. US 2010/0311250, which is incorporated by reference herein, discloses further exemplary materials and provides additional information relating to controlled spalling. Controlled spalling techniques could be employed with respect to structures as shown in FIGS. 2A and 3. Other techniques familiar to those of skill in the art could be employed for thinning the substrate and enhancing flexibility. In some embodiments, chemical/mechanical polishing and/or etching and/or grinding can be used to remove all or part of the rigid handle layer 22. In other exemplary embodiments, a layer lift-off process is used to separate the chips from the handle layer. Such a process involves providing an embedded, sacrificial layer (not shown) that is selectively etched.

Figure 5A:
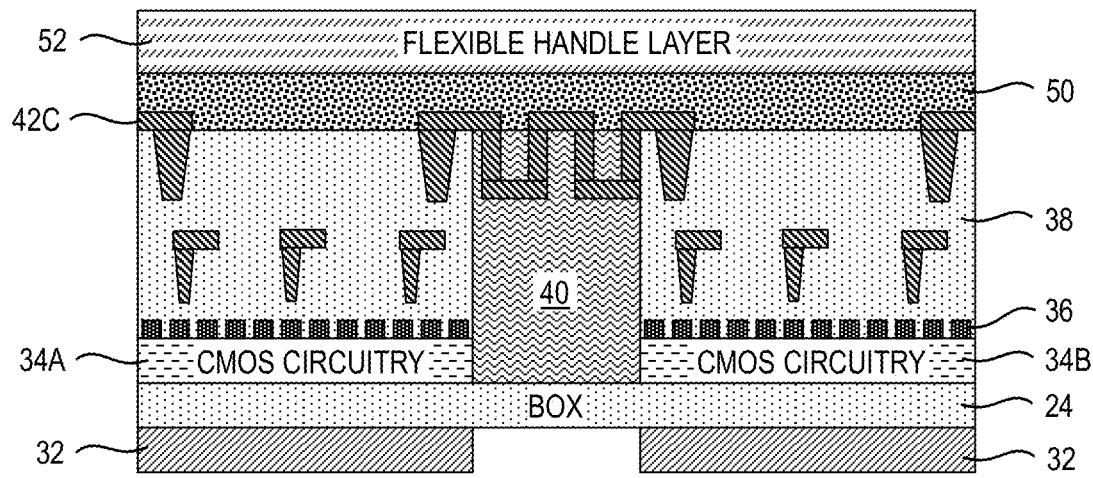
FIG. 5A is a schematic illustration of a fabrication step showing removal of a residual handle layer from the structure shown in FIG. 4.

Removal of the residual layer 56, for example by etching, without removing the separator layer 40 from the structure shown in FIG. 4 layer provides a structure as shown in FIG. 5A. In the exemplary embodiment of FIG. 5B, the separator layer 40 is entirely sacrificial and completely removed following the removal of the residual layer 56 from the structure. A space 60 is formed that separates a first region 34A of the circuitry layer 34 from a second region 34B thereof. The wires 144 extend through the space and electrically connect the first and second regions of the circuitry layer 34. An etching process is employed to remove the sacrificial separator layer. The p+ and/or n+ pockets formed in the handle layer function as an etch mask for the selective removal of the sacrificial separator layer with respect to the insulating (BOX) layer. The portion of the insulating layer 24 beneath the separator layer 40 is also removed in the etching process as it does not adjoin an etch stop layer. Reactive ion etching (RIE) and/or wet chemical etching are among the techniques that may be employed. Etching is conducted from the bottom of the structure in the exemplary embodiment of FIG. 5C. The etchants are chosen based on the material(s) employed for forming the insulating layers 24, 38 and the separator layer 40 in order to minimize over-etch of the layers 24 and 38 while removing the separator layer 40. For example, in embodiments where the insulating layer and the separator layer are both silicon dioxide, hydrogen fluoride (HF) may be effectively employed. A combination of dry and wet etches may be used to minimize the over-etch of the insulating layers 24 and 38. The circuitry layer, metal layer(s) and layer 38 of insulating material should not be materially affected by the process of removing the separator layer to form the space 60.

Figure 5B:
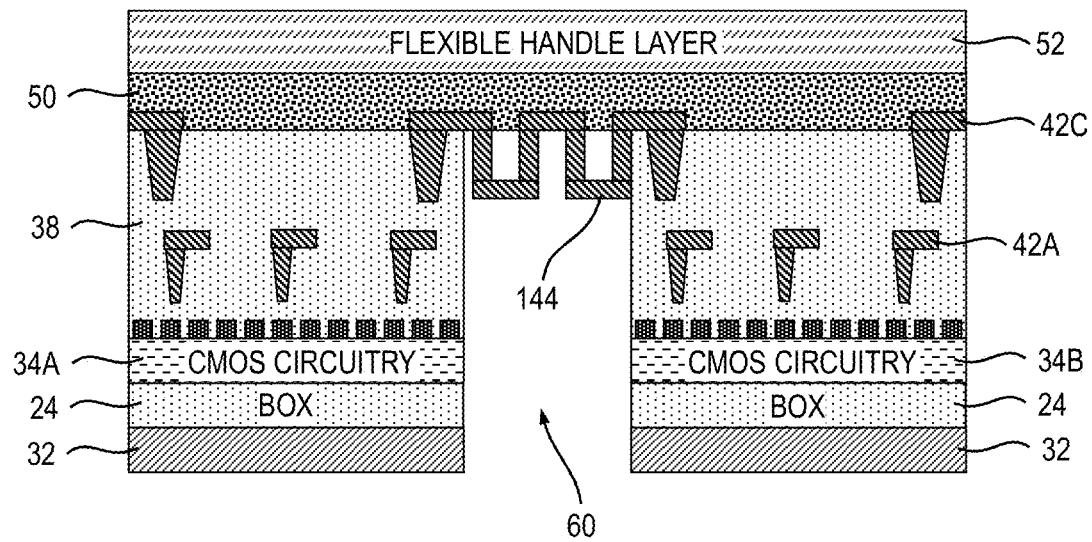
FIG. 5B is a schematic illustration of a fabrication step showing selective removal of the sacrificial separator layer and residual handle layer from the structure shown in FIG. 4.
Figure 5C:
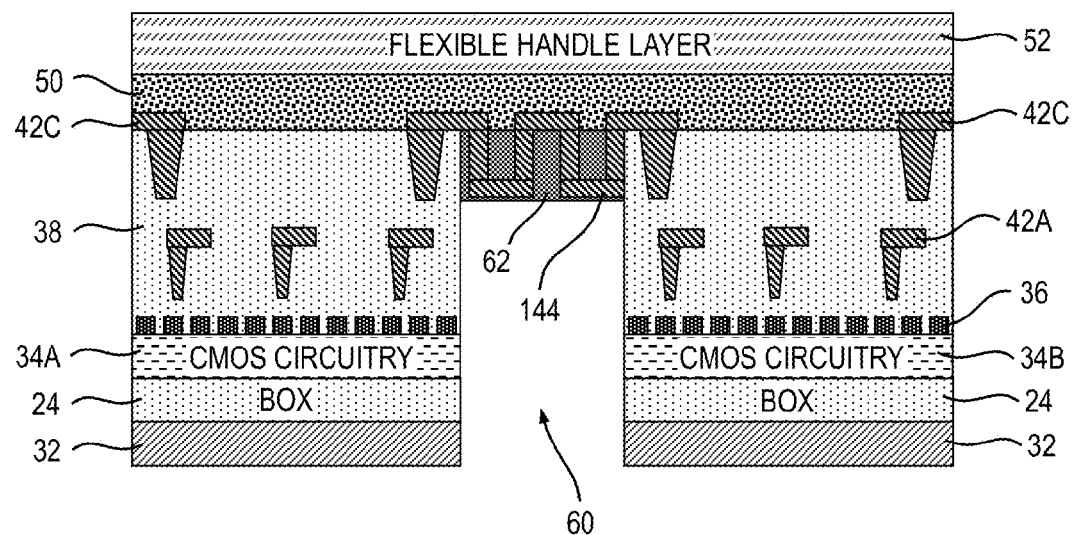
FIG. 5C is a schematic illustration of a fabrication step showing selective removal of the sacrificial separator layer and residual handle layer from the structure shown in FIG. 4 in accordance with an alternative embodiment wherein a low-k dielectric layer encases the electrical wires connecting at least two circuits.

Layers of different materials are deposited on the insulating layer 24 in some embodiments for forming the separator layer 40. In one exemplary embodiment, sacrificial material such as silicon dioxide is initially deposited on the insulating layer 24. Silicon dioxide has a large Young's modulus. A material having a relatively low modulus of elasticity (Young's modulus), substantially lower than that of silicon dioxide, is deposited on the sacrificial portion of the separator layer. This allows the wires (e.g. wires 44, 144) to be formed on and/or within a layer 62 of low-k dielectric material. Examples of low-k dielectrics include spin-on organic low-k polymers such as polyimide, polynorborenes, benzocyclobuten, and PTFE. Removal of the residual layer 56 and the separator layer 40 from such a structure provides a structure as shown in FIG. 5C wherein the wires are substantially encased by the layer 62 and thereby protected. As the material comprising the layer 62 has a low modulus of elasticity, it can be stretched to an acceptable extent without fracturing, while electrically isolating the wires from the adjacent ones. As discussed above, the wire configurations also facilitate stretching without fracture and resulting loss of electrical conductivity.

Figure 6A:
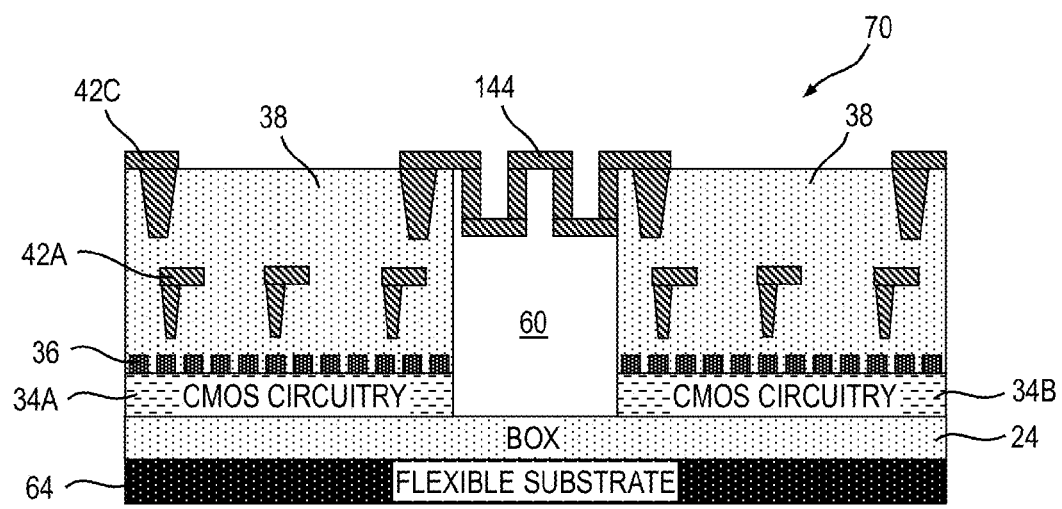
FIG. 6A is a schematic illustration showing transfer of an exemplary structure to a flexible substrate and selective removal of the sacrificial separator layer.

Referring to FIG. 6A, a structure as described above with respect to FIG. 2B is transferred to a flexible substrate 64 in accordance with one or more embodiments of the fabrication process. The flexible substrate 64 includes an adhesive coating (not shown) that will provide adhesion to the structure. Such transfer is effected following removal of the handle layer 22 and residual layer 56 beneath the insulating layer 24. As discussed above, layer transfer is a technique that can be employed in the fabrication of the structure 70 shown in FIG. 6A. Once transferred to the flexible substrate 64, selective removal of the sacrificial separator layer frees the wires 144 connecting the first and second circuitry regions 34A, 34B. Etching from the top of the structure in the direction of the insulating layer 24 is conducted in this exemplary embodiment. The BOX layer 24 may be fully or partially etched during the removal of the sacrificial layer. In this exemplary embodiment, the structure is transferred to the flexible substrate 64 having a relatively low Young's modulus prior to removal of the separator layer. The flexible substrate 64 comprises an elastomeric sheet having a low modulus of elasticity, for example about sixty kilopascals to a few megapascals in some embodiments. Exemplary materials include polydimethylsiloxane (PDMS) and polyvinyl alcohol (PVA). Young's modulus for PDMS has been found to be in the range of 360-870 KPa. In one or more embodiments, the thickness of the flexible substrate is between twenty and two hundred microns.

Figure 6B:
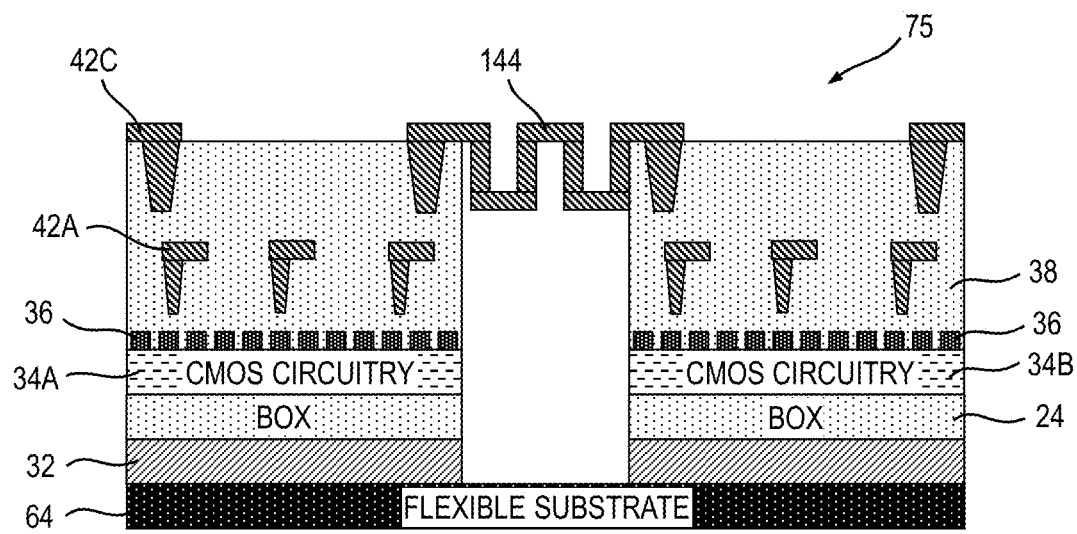
FIG. 6B is a schematic illustration showing transfer of a second exemplary structure to a flexible substrate.

In an alternative embodiment as shown in FIG. 6B, a structure is transferred to a flexible substrate followed by the removal of any backing layer (not shown) that may be employed in a lift-off process or a stressor layer 50 if a controlled spalling process has been previously performed. In this embodiment, the separator layer 40, which is entirely sacrificial, is removed prior to transferring the structure to the flexible substrate 64. In one exemplary embodiment, a structure as shown in FIG. 5B is first obtained. This structure is then transferred to the flexible substrate 64 and the stressor layer 50 is removed to obtain the structure 75 shown in FIG. 6B. If the stressor layer is metal, an insulating layer is deposited to separate the metal stressor layer from the contacts. The stressor layer may be removed via chemical etch. The etch stop regions 32 shown in FIG. 6B could alternatively comprise a residual silicon layer 56. The etch stop regions are optional in some embodiments.

Figure 6C:
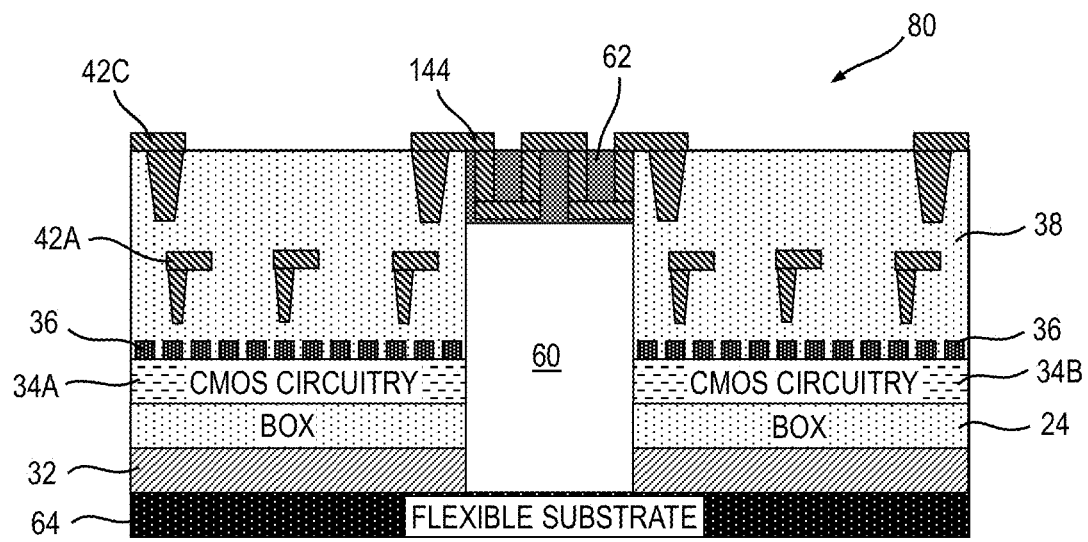
FIG. 6C is a schematic illustration showing transfer of a third exemplary structure to a flexible substrate.

In another exemplary embodiment, a structure as shown in FIG. 5C is obtained. The structure is transferred to a flexible substrate 64 followed by removal of the stressor layer 50 and flexible handle layer to provide the structure 80 shown in FIG. 6C.

Given the discussion thus far, an exemplary structure has a semiconductor substrate including an electrically insulating layer 24 and a circuitry layer comprising first and second CMOS circuitry regions 34A, 34B formed on the substrate and adjoining the electrically insulating layer. A first layer 38 comprising electrically insulating material adjoins the circuitry layer. A separator layer 40 within the first layer electrically isolates the first and second CMOS circuitry regions. An electrical connector layer electrically connects the first and second circuitry regions. The electrical connector layer is formed within the first layer and extends across the separator layer. A further exemplary structure is obtained by removing the separator layer, leaving the electrical connector layer in place. As shown, for example, in FIGS. 6A-C, the circuitry regions 34A, 34B remain connected by one or more serpentine connector wires 144 that allow the structures 70, 75, 80 to be stretched or squeezed without damage. As the wires 144 are formed during back end of the line processing, the difficulties associated with wiring circuitry regions following the CMOS fabrication process using soldering or other techniques is avoided.

A first exemplary method includes forming an electronic circuitry layer 34 having first and second circuitry regions 34A, 34B on a semiconductor substrate 20. A separator layer 40 is formed on the substrate that separates the first and second circuitry regions. A layer 38 comprising electrically insulating material is formed on the circuitry layer. An electrical connector layer, including for example wires 44, 144 or 244, is formed between the first and second circuitry regions and extends across the separator layer. The separator layer 40 is removed to form a space 60 beneath the electrical connector layer. The space 60 separates the first and second circuitry regions of the circuitry layer 34. In some embodiments, the wires are suspended in air following formation of the space 60. In other embodiments, the wires are embedded in a material having a low Young's modulus.

A second exemplary method includes obtaining a structure including a semiconductor substrate 20, a circuitry layer 34 comprising first and second circuitry regions 34A, 34B deposited on the substrate, the circuitry layer comprising CMOS devices, a separator layer 40 on the substrate that separates the first and second circuitry regions of the circuitry layer, a layer comprising electrically insulating material on the circuitry layer, one or more metal layers within the electrically insulating material, and an electrical connector layer 44, 144, 244 between the first and second circuitry regions and extending across the sacrificial separator layer. The exemplary method further includes thinning the substrate, removing at least part of the separator layer to form a space 60 beneath the electrical connector layer and within the layer comprising electrically insulating material, and affixing the substrate to a flexible layer. In one or more embodiments, the step of removing at least part of the separator layer 40 is performed subsequent to affixing the substrate to the flexible layer.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Terms such as "top" and "bottom" are used to designate relative positions of elements as opposed to elevation. For example, the "top" surface of a structure can face up, down, or any other direction.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A structure comprising:
    a semiconductor substrate including an electrically insulating layer;
    a circuitry layer comprising first and second CMOS circuitry regions formed on the substrate and adjoining the electrically insulating layer;
    a first layer comprising electrically insulating material on the circuitry layer;
    a separator layer on the substrate and within the first layer, the separator layer electrically isolating the first and second CMOS circuitry regions;
    an electrical connector layer electrically connecting the first and second circuitry regions, the electrical connector layer being formed within the first layer and extending across the separator layer.

2. The structure of claim 1, wherein the separator layer comprises a sacrificial layer adjoining the substrate and a second layer on the sacrificial layer, the second layer having a substantially lower Young's modulus than the sacrificial layer, the electrical connector layer adjoining the second layer.

3. The structure of claim 1, further including a first and second etch stop regions within the substrate, the first CMOS circuitry region being positioned over the first etch stop region and the second CMOS circuitry region being positioned over the second etch stop region, the separator layer being positioned over a portion of the substrate between the first and second etch stop regions.

* * * * *